United States Patent [19]
Koester et al.

[11] 3,984,763
[45] Oct. 5, 1976

[54] DEVICE FOR THE NON-DESTRUCTIVE MEASUREMENT OF THE REMANENT FLUX DENSITY OF MAGNETIC RECORDING MEDIA, ESPECIALLY MAGNETIC DISCS

[75] Inventors: Eberhard Koester, Frankenthal; Paul Deigner, Weisenheim; Roland Falk, Achern; Georg Huber, Willstaett; Karl Uhl, Frankenthal, all of Germany

[73] Assignee: BASF Aktiengesellschaft, Ludwigshafen (Rhine), Germany

[22] Filed: Sept. 30, 1975

[21] Appl. No.: 618,041

[30]    Foreign Application Priority Data
    Sept. 28, 1974    Germany............................ 2446488

[52] U.S. Cl................................ 324/34 TA; 360/31
[51] Int. Cl.²........................................... G01R 33/12
[58] Field of Search.......... 324/34 R, 34 TA; 360/6, 360/31

[56]             References Cited
              UNITED STATES PATENTS
2,922,106    1/1960    Oates et al. ..................... 324/34 TA

*Primary Examiner*—Robert J. Corcoran
*Attorney, Agent, or Firm*—Johnston, Keil, Thompson & Shurtleff

[57]             ABSTRACT

The invention concerns a device for the non-destructive measurement of the remanent flux density of magnetic recording media, by recording a specific signal and reproducing the recorded signal by means of two pairs of magnetic recording and playback heads arranged opposite one another and perpendicular to the plane of the recording medium, the ratio of the distance between the individual magnetic heads of each pair of heads to the wavelength of the recorded signal being within a specific range, and the said distance being such that a magnetic recording medium is movable symmetrically between the pair of heads, a common measuring unit being associated with the playback pair. Further features of the device relate to the design of the magnetic recording and playback heads, the measuring unit and the rate at which the particular magnetic recording medium being tested moves between the pairs of heads.

10 Claims, 5 Drawing Figures

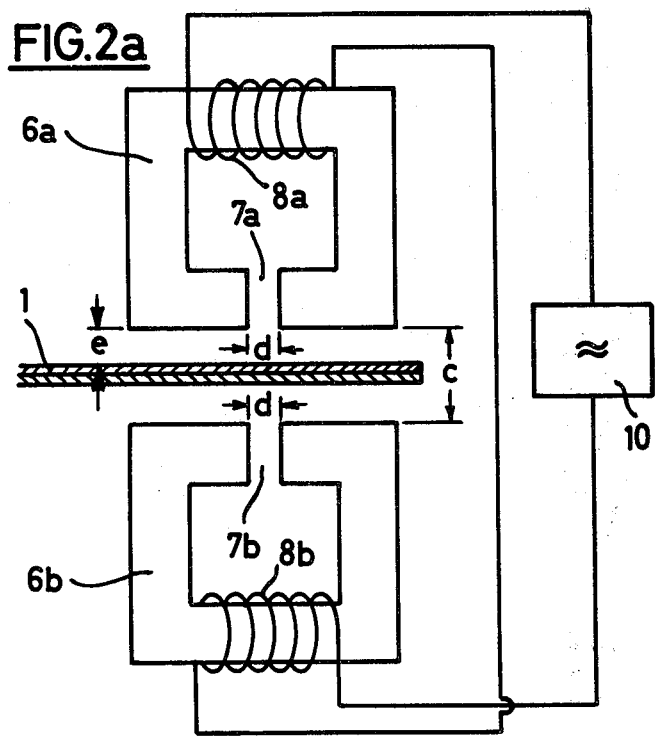
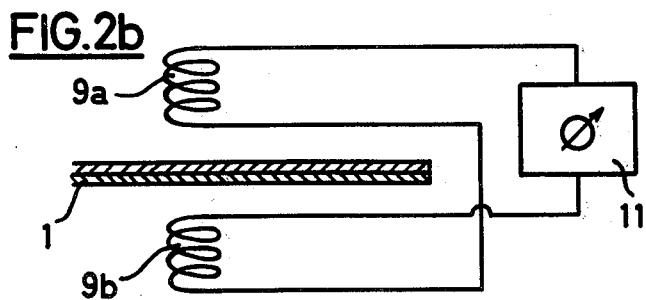

DEVICE FOR THE NON-DESTRUCTIVE MEASUREMENT OF THE REMANENT FLUX DENSITY OF MAGNETIC RECORDING MEDIA, ESPECIALLY MAGNETIC DISCS

The present invention concerns a device for the non-destructive measurement of the remanent flux density of magnetic recording media, especially magnetic discs, by recording specific signals by means of at least one recording head and by subsequently reading these signals by means of at least one playback head and measuring the read voltage.

Magnetic discs for data storage applications can be manufactured by applying a thin layer of a dispersion of a finely divided magnetizable material in an organic binder to a circular disc consisting of a non-magnetic metal or of glass and then drying the applied layer. Another process for manufacturing magnetic discs is the chemical or electrolytic deposition of thin films of magnetizable material on circular discs of metal or glass. Furthermore, magnetizable metallic or oxidic films may be deposited from the gaseous phase on the base. Whatever the process, it is essential that the applied magnetizable coating should exhibit a uniform remanent flux density, if uniform quality is to be achieved.

It is known to use magnetometers of conventional design for the direct measurement of the flux density. The disadvantage of using such equipment is that a sample has to be cut from the magnetic disc, i.e., the disc has to be destroyed to carry out the measurement. Consequently, this known test method cannot be employed to continuously check the flux density during production of the magnetic recording medium.

Another known process for the non-destructive measurement of the remanent flux density in recording media consists in moving the medium past write and read heads under conditions similar to those encountered in the field on tape recorders or memory drive units. The read voltage serves as a measure of the remanent flux density of the magnetic layer. The main disadvantage of this method and the appropriate equipment is that freshly manufactured magnetic coatings are easily scratched by the heads which are usually in contact with, or at a small distance (a few microns) from, the coating. The test equipment is required to exhibit a high degree of mechanical precision, especially for testing magnetic discs, and the magnetic disc has to be completely finished before testing can take place. This means that the magnetizable layer, prior to testing, has to be cured and then ground and polished, which is a further disadvantage. As a result, continuous control of the coating operation, which is essential for ensuring a constant remanent flux density in the magnetic coating, is not possible with this procedure and equipment either.

It is also known to effect measurement of the remanent flux density using two magnetic heads, one for recording a signal of a certain frequency and the other for reproducing the recorded signal, and to carry out the measurement immediately downstream of the coater in a magnetic tape coating plant. However, since the coating is not yet dry at this stage, the recording and reproducing heads must be applied to the uncoated side of the base film. In this case, the base film acts as a spacer, and the magnetic fields therefore have to pass through the film to reach the still fluid coating. In order to prevent the accuracy of the measurement from being affected by the thickness of the base film, the gap of at least the recording head must be very large. However, the magnetic heads that are in contact with the underside of the moving web of film are quickly soiled, as a result of which the measurement is inaccurate.

An object of the present invention is to provide a device suitable for the continuous non-destructive measurement of the remanent flux density of magnetic recording media, particularly magnetic discs, during their production, which device does not suffer from any of the disadvantages of known procedures and equipment.

This object is achieved by a device for the non-destructive measurement of the remanent flux density of magnetic recording media, especially magnetic discs, by recording specific signals by means of at least one recording head and subsequently reproducing the recorded signals by means of at least one playback head, and by measuring the read voltage, wherein there are provided, on both sides of the moving recording medium to be tested and at substantially equal distances from the surfaces of the recording medium, two pairs of recording heads and playback heads in mutually opposed relationship, each pair of heads being arranged perpendicular to said surfaces, the frequency of the write currents being matched to the rate at which the recording medium moves in such a way that the distance of the recording and the playback heads from the surfaces of the recording medium is between 1/5 and 1/40 of the wavelength of the specific signals recorded on the recording medium, and wherein a common measuring system is provided by means of which the sum total of the read voltages is measured.

The employment of a device as proposed by the invention has the following advantages:

1. Recording and playback heads can be used which are simple and inexpensive to manufacture.
2. The distance between the heads and the recording medium may vary by up to about 30% of the predetermined distance, without having a detrimental effect on the measurement.
3. The distance separating the heads of each pair facilitates the introduction of the magnetic recording medium therebetween.
4. Low-frequency energizing currents, which produce long-wave recording signals, can be used.
5. Commercially available electronic components and measuring instruments may be used in the common mesuring unit.
6. The device of the invention may be used in the continuous production of magnetic recording media for control purposes, thus enabling recording media to which magnetic coatings deviating from the required thickness have been applied, to be eliminated at an early stage or to be subjected to aftertreatment.

In an advantageous embodiment of the device of the invention, the heads of the recording pair are designed, and aligned relative to one another and to the recording medium, in such a way that the magnetizations produced by each of the magnetic fields in the magnetic layer extend parallel with the plane of the recording medium and have the same direction.

The writing and reading operations can thus be greatly simplified, a high degree of accuracy when measuring the read voltages being attained.

In a further embodiment of the invention, each of the heads constituting a pair is arranged at a distance of from about 1 to 15 mm, and preferably from about 2 to 9 mm, from the surface of the recording medium. The frequency of the current used the energize the magnetic heads constituting the recording pair is preferably between about 25 to 300 Hz. The rate at which the recording medium moves is preferably between about 2.0 and 8.0 m/s. A generally applicable and reliable measuring device is thus obtained. For example, movement of the recording medium relative to the heads is possible without there being any risk of a freshly produced magnetic layer being damaged.

In other simple embodiments of the device of the invention, the recording and playback heads each consist of a magnetic circuit with an air gap and coil, the width of the gaps being of the same order of magnitude as the distance of the heads from the recording medium, preferably from 2 to 9 mm. Advantageously, each recording head consists of a magnetic circuit with an air gap and a coil, and each of the playback heads of an induction coil without a core.

According to the invention, the measuring unit for measuring the read voltages of both playback heads comprises at least one summing amplifier and, preferably, an integrating element. This enables the sum total of the read volages to be determined in a simple manner, substantially irrespective of whether the distances between the individual heads of the playback pair and the surfaces of the recording medium are identical, and independently of the fluctuations which inevitably occur during the measurement.

Further details of the device of the invention will now be described and explained with reference to the embodiments given by way of example and illustrated in the drawings, in which FIG. 1 is a diagrammatic representation of a drive unit for magnetic discs, with a device according to the present invention;

FIG. 2a shows a pair of recording heads according to the invention;

FIG. 2b shows a pair of playback heads according to the invention;

Figure 4:
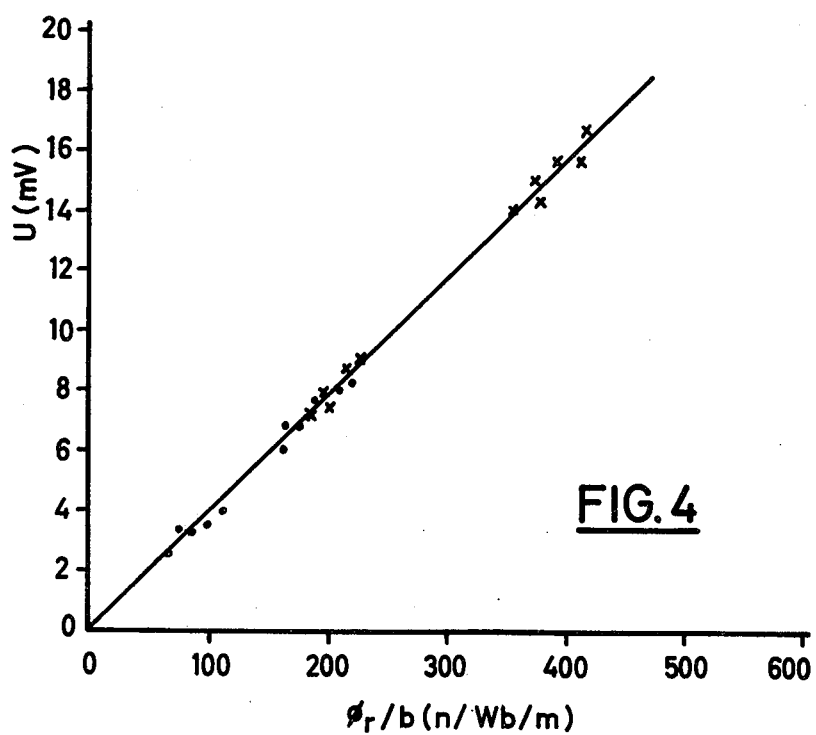

FIG. 4 a flux density vs. read voltage diagram, to be used in conjunction with the device of the invention.

Figure 1:
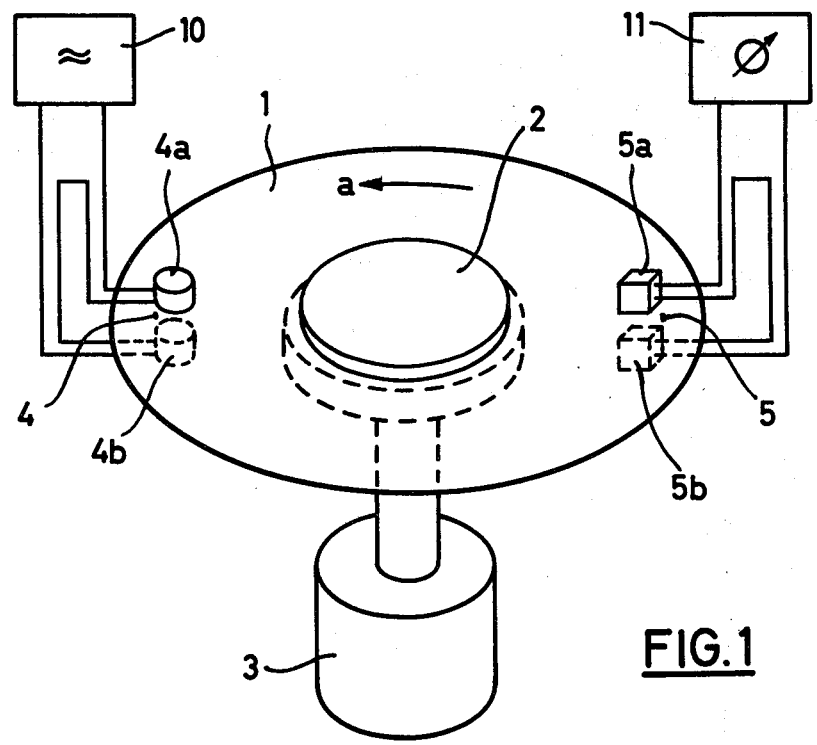

FIG. 1 shows a device for measuring the remanent magnetic flux of a commerical magnetic disc 1. The disc 1 is placed upon a receiving member 2, the latter being driven by a electric motor 3. The speed of the member 2, and thus the speed of the disc 1, is suitably adjustable, and preferably covers a range between about 120 and 500 revolutions/min., giving a speed range of about 2 to 8 m/s for a disc of the usual dimensions. Above and below the disc 1, roughly symmetrical with respect to the plane of the disc 1, are arranged a pair 4 of write heads 4a and 4b and a pair 5 of read heads 5a and 5b, in diametrically opposed positions. The write heads 4a and 4b consist, for example, of magnetic circuits 6a and 6b with air gaps 7a and 7b respectively (see FIG. 2a). The width d of the air gaps 7a and 7b is preferably of the same order of magnitude as the distance e between each of the write heads 4a, 4b and the disc 1, the distance e being between 1 and 15 mm, and preferably between 2 and 9 mm.

The write heads 4a and 4b are energized by alternating current supplied from a source 10, e.g. from the mains, to coils 8a and 8b. The wave form of the alternating current employed is not important. However, it has been found advantageous to use alternating current having a frequency of approximately 25 to 300 Hz, preferably mains current of 50 Hz or 60 Hz.

It is however important for the device of the invention that the coils 8a and 8b of the write heads 4a and 4b should be connected in series or parallel with the current source 10 in such a way that the lines of force of the magnetic fields created by both heads 4a and 4b in the magnetic coating of the disc 10 are always parallel to the plane of the disc, opposite poles being of the same polarity.

In order to determine the magnetization of the signal recorded on the magnetic disc 1, which magnetization changes its polarity and amplitude, a pair 5 of read heads follows the pair 4 of write heads in the direction of rotation (arrow a) of the disc 1. The heads 5a and 5b may be of the same design as the write heads 4a and 4b of FIG. 1 (FIG. 2a) or in the form of simple induction coils 9a and 9b (see FIG. 2b). According to the law of induction, the changing remanent flux in the disc 1 generates in the read heads 4a and 4b an alternating voltage, $Ua$ and $Ub$ respectively. The sum total of these alternating voltages is fed to the measuring unit 11 and is indicated on a commercial millivoltmeter either directly or after suitable amplification and rectification.

Figure 3:
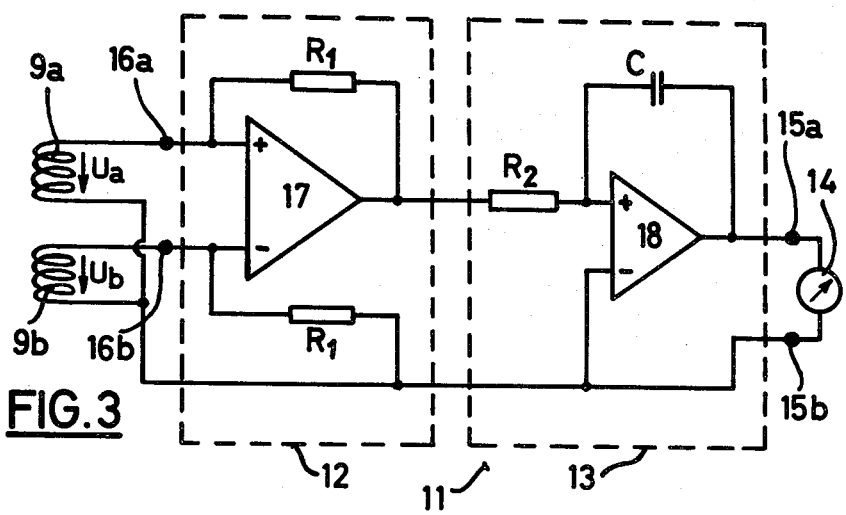
FIG. 3 is a block diagram of the measuring unit proposed by the invention.

FIG. 3 shows an advantageous circuit arrangement of such a measuring unit 11 which comprises a summing stage 12, an integrating stage 13 and a millivoltmeter 14, connected to the output terminals 15a, 15b of stage 13, if necessary via a rectifier not shown here. Connected to the input terminals 16a, 16b of stage 12 are the induction coils 9a and 9b, the pair constituting the read heads. Stage 12 comprises an analogue operational amplifier 17 of symmetrical design with two identical resistors $R_1$. Stage 13 comprises the input resistor $R_2$ which acts as the integrating element and the capacitance C, the latter being connected in parallel with a suitable amplifier 18. The sum of the voltages $Ua$ and $Ub$ is formed and appropriately amplified by the summing stage 12. The integrating stage 13 eliminates the fluctuations which occur during the measurement, for example variations in the rotational speed of the disc. When using the device of the invention for the non-destructive measurement of the remanent flux density in recording media, it is immaterial whether both sides or only one side of the recording medium carries a magnetizable layer. All that is necessary is the case of a medium coated on both sides is to ensure that the sum total of the remanent flux densities of both coatings is measured. If this requirement is fulfilled, variations in the distance of the pairs of heads from the recording medium of up to 30% of the predetermined distance do not produce noticeable errors of measurement.

Although the device of the invention for the non-destructive measurement of the remanent flux density without being in contact with the recording medium has been described here mainly with reference to the testing of magnetic discs, it may easily be applied to recording media executing a linear movement, sich as tapes, cards, etc.

The linear relationship between the remanent flux density measured with the aid of a magnetometer of conventional design, which involves the destruction of the recording medium, and the voltage measured at the pair 5 of read heads of FIG. 1 with the device of the invention is shown in FIG. 4. Here, the measured voltage $U = f(\phi_r/b)$ has been plotted in $n/Wb/m$. $\phi_r/b$ is the absolute flux of the recording medium, expressed in $10^{-9}$ Weber per meter, $b$ being the width of the flux.

The results have been obtained with magnetic discs with a magnetic coating on one side only (crosses) and magnetic discs with magnetic coatings on both sides (dots).

The remanent flux is determined simply by reading the value indicated on the instrument 14 and reading off the flux value in $n/Wb/m$ from the curve of FIG. 4.

EXAMPLE

A magnetic disc of the usual dimensions was driven at 180 r.p.m. (3 m/s for a circumference of approximately 1 m). The frequency of the magnetizing current at the pair 4 was 50 Hz. The distance $c$ between heads $4a$ and $4b$ was 8.5 mm which, for a disc thickness of approximately 2 mm, meant that the distance $e$ of each head from each side of the disc was 3.25 mm. Each of the heads $4a$ and $4b$ had a gap having a width $d$ of 3 mm. Magnetic heads having gaps as wide as this can be manufactured easily and at low cost and are therefore very economical. With the abovementioned data, the wavelength $\lambda$ of the recorded signal was 60 mm. This made the distance of the individual heads from the sides of the disc approximately equal to 1/20 of the wavelength $\lambda$, the width $d$ of the gap corresponding roughly to the individual distance $e$.

Other measurement conditions, with which those skilled in the art are familiar and which therefore need not be described in more detail here, may be chosen. The above-described device has been found to be outstandingly effective in the manufacture of magnetic discs and magnetic tape. Control devices may be employed in conjunction with the device of the invention for the purpose of achieving automatic control of the coating operation.

We claim:

1. A device for the non-destructive measurement of the remanent flux density of magnetic recording media, especially magnetic discs, by recording specific signals by means of at least one recording head and subsequently reproducing the recorded signals by means of at least one playback head and by measuring the read voltage, wherein there are provided, on both sides of the moving recording medium to be tested and at substantially equal distances from the surfaces of the recording medium, a pair of recording heads and a pair of playback heads in mutually opposed relationship, each pair of heads being arranged perpendicular to the said sufaces, the frequency of the write current being matched to the rate at which the recording medium moves in such a way that the distance of the recording and the playback heads from the surfaces of the recording medium is between 1/5 and 1/40 of the wavelength of the specific signals recorded on the recording medium, and wherein there is provided a common measuring unit by means of which the sum total of the read voltages is measured.

2. A device according to claim 1, wherein the heads of the recording pair are designed, and aligned relative to one another and to the recording medium, in such a way that the magnetizations produced in the magnetic layer by each of the magnetic fields extend parallel with the plane of the recording medium and have the same direction.

3. A device according to claim 1, wherein the distance of each of the heads constituting a pair from the surface of the recording medium is from about 1 to 15 mm.

4. A device according to claim 1, wherein the distance of each of the heads constituting a pair from the surface of the recording medium is from about 2 to 9 mm.

5. A device according to claim 1, wherein the frequency of the current energizing the heads constituting the recording pair is preferably between approximately 25 and 300 Hz.

6. A device according to claim 1, wherein the recording medium preferably moves at a speed of between approximately 2.0 and 8.0 m/s.

7. A device for the non-destructive measurement of the remanent flux density of magnetic recording media, especially magnetic discs, by recording specific signals by means of at least one recording head and subsequently reproducing the recording signals by means of at least one playback head, and by measuring the read voltage, wherein there are arranged, on both sides of the moving recording medium to be tested and at substantially equal distances from the surfaces of the recording medium, a pair of recording heads and a pair of playback heads in mutually opposed relationship, each pair of heads being arranged perpendicular to the said surfaces, the frequency of the write currents being matched to the rate at which the recording medium moves in such a way that the distance of the recording and playback heads from the surfaces of the recording medium is from about 1 to 15 mm and is thus 1/5 to 1/40 of the wavelength of the specific signals recorded on the medium, and wherein a common measuring unit is provided by means of which the sum total of the read voltages is measured.

8. A device according to claim 7, wherein the recording and playback heads each consists of a magnetic circuit with an air gap and coil, the width of the gaps being of the same order of magnitude as the distance of the heads from the recording medium.

9. A device according to claim 7, wherein each recording head consists of a magnetic circuit with an air gap and coil, and each playback head of an induction coil without a core.

10. A device according to claim 7, wherein the measuring unit for measuring the read voltages of both playback heads comprises at least one summing amplifier and one integrating element.

* * * * *